United States Patent [19]

Emesh et al.

[11] Patent Number: 5,452,178
[45] Date of Patent: Sep. 19, 1995

[54] STRUCTURE AND METHOD OF MAKING A CAPACITOR FOR AN INTERGRATED CIRCUIT

[75] Inventors: Ismail T. Emesh, Cumberland; Iain D. Calder; Vu Q. Ho, both of Kanata; Gurvinder Jolly, Orleans; Lynnette D. Madsen, Ottawa, all of Canada

[73] Assignees: Northern Telecom Limited, Montreal; McMaster University, Hamilton, both of Canada

[21] Appl. No.: 224,499

[22] Filed: Apr. 7, 1994

Related U.S. Application Data

[62] Division of Ser. No. 125,264, Sep. 23, 1993, Pat. No. 5,330,931.

[51] Int. Cl.⁶ ........................... H01G 4/005; H01G 4/228
[52] U.S. Cl. ............................ 361/303; 361/306.1; 437/919
[58] Field of Search ....................... 361/301.2, 311, 312, 361/313, 303, 321.1, 306.1; 174/262–267; 257/295, 301–303, 310, 300; 365/145, 149; 437/919

[56] References Cited

U.S. PATENT DOCUMENTS

| | | | |
|---|---|---|---|
| 5,218,512 | 6/1993 | Nakamura | 361/321.1 |
| 5,227,855 | 7/1993 | Momose | 365/145 |
| 5,335,138 | 8/1994 | Sandhu et al. | 361/303 |

FOREIGN PATENT DOCUMENTS

| | | |
|---|---|---|
| 0495991 | 7/1992 | European Pat. Off. . |
| 0497982 | 8/1992 | European Pat. Off. . |

*Primary Examiner*—Kristine L. Kincaid
*Assistant Examiner*—Michael D. Switzer
*Attorney, Agent, or Firm*—Angela C. de Wilton

[57] ABSTRACT

A capacitor structure for a memory element of an integrated circuit is provided. The capacitor is formed within a via hole defined through a first dielectric layer, and comprises a bottom electrode defined by an underlying conductive layer, and a capacitor dielectric filling the via with a dielectric barrier layer lining the via and separating the capacitor dielectric from the first dielectric layer. The capacitor dielectric is characterized by a material with high dielectric strength, preferably a ferroelectric material. An overlying conductive layer defines a top electrode contacting the capacitor dielectric. The barrier layer may comprise dielectric sidewall spacer formed within the via, or alternatively may comprise a region of mixed composition formed by interdiffusion of the first dielectric layer and the capacitor dielectric. The resulting capacitor structure is simple and compact, and may be fabricated with known CMOS, Bipolar or Bipolar-CMOS processes for submicron VLSI and ULSI integrated circuit.

10 Claims, 6 Drawing Sheets

STRUCTURE AND METHOD OF MAKING A CAPACITOR FOR AN INTERGRATED CIRCUIT

This is a division of patent application Ser. No. 08/125,264, filed on Sep. 23, 1993, now U.S. Pat. No. 5,330,931 by Ismail T. Emesh, et al for "Structure and Method of Making a Capacitor For an Integrated Circuit".

FIELD OF THE INVENTION

This invention relates to a capacitor structure and a method of making a capacitor for an integrated circuit, with particular application to ferroelectric capacitors for ferroelectric random access memories.

BACKGROUND OF THE INVENTION

Ferroelectric random access memory elements (FERRAMs) for integrated circuits take advantage of the properties of a ferroelectric dielectric material as a capacitor dielectric. Preferred ferroelectric dielectric materials are those of a perovskite structure, including titanates such as lead zirconate titanate (PZT), barium strontium titanate, and many others. Typically these ferroelectric dielectric materials have a very high dielectric constant ($\epsilon>>100$) compared with conventional capacitor dielectrics used in integrated circuits, e.g. $SiO_2$ and $Si_3N_4$ ($\epsilon<10$). Moreover, one of two stable polarization states may be induced in a ferroelectric material, dependent on the polarity of an applied voltage, and the ferroelectric material remains in a selected polarization state after removal of the voltage. Thus a high density ferroelectric memory element may be provided which is non-volatile. Other known advantages of FERRAMs are that they are programable with less than 5 V, have fast access times (<40 ns), consume low power, are robust with respect to a large number of read/write cycles, and exhibit radiation hardness.

The interest in using ferroelectric materials for applications for non-volatile DRAMs has led to rapid development of improved processes for deposition of layers of ferroelectric dielectric materials. Known deposition methods which have been investigated for integrated circuit applications include, for example, metallo-organic sol-gel and other spin-on liquid processes, chemical vapour deposition (CVD), sputtering, laser ablation, electron beam deposition and ion beam deposition.

On the other hand, integration of ferroelectric capacitors into complementary metal oxide semiconductor (CMOS), bipolar, or bipolar-CMOS integrated circuits requires a process which is compatible with known process technology.

As an example, in a known conventional DRAM memory cell of one capacitor/one transistor type having charge stored in a memory cell capacitor, the capacitor is selectively coupled through the source-drain path of a MOS field effect transistor (access transistor) to a bit line, and the gate electrode of the access transistor is coupled to a word line. A conventional approach to building memory cells involves formation of access transistors in a semiconductor substrate wafer and fabrication of a planar capacitor structure on top of a dielectric layer, e.g. a field isolation layer, on the substrate adjacent to each transistor. Capacitors are formed conventionally by deposition of a first conductive layer, a capacitor dielectric layer and an overlying second conductive layer. The sandwich of layers is patterned and etched to define each capacitor, i.e. first and second conductive electrodes and an intervening capacitor dielectric.

Etching is typically accomplished by a dry etch process, e.g. reactive ion etching. However, problems arise in applying conventional dry etch chemistry for patterning ferroelectric dielectric materials such as PZT ($PbZr_xTi_{1-x}O_3$) which include elements not found in conventional semiconductor materials.

A publication by Sanchez et al. for the International Symposium on Integrated Ferroelectrics, 1991, entitled "Process technology developments for GaAs ferroelectric non-volatile memories" describes the use of a step of ion milling to etch and define a top electrode and an underlying ferroelectric dielectric layer, followed by masking and another step of ion milling to define the lower electrode.

Alternatively, wet etching methods for patterning ferroelectric materials have been investigated for fabrication of conventional flat plate capacitors with a ferroelectric dielectric material, for example as described in U.S. Pat. No. 4,759,823 to Asselanis, entitled "Method for Patterning PLZT thin films".

Furthermore, many perovskite ferroelectric dielectrics of interest for FERRAMs react with silicon and silicon containing materials. Thus, a conventional DRAM cell structure having polysilicon electrodes, or a bottom electrode provided by a region of a silicon substrate, is not feasible.

Ferroelectric dielectric materials are also known to react and interdiffuse with conventional dielectric materials, e.g. silicon dioxide, silicon nitride. Interdiffusion of impurities may occur at the interface between a ferroelectric capacitor dielectric and a conventional dielectric. Other interactions of ferroelectric materials occur with conductive layers used for electrodes. The latter, for example, can result in formation of non-conductive oxides at the electrode interface.

Diffusion of elements such as lead and titanium, and reaction of the ferroelectric material with electrode materials with which they are in contact may be avoided by provision of a suitable barrier layer between the ferroelectric material and the electrode material. Alternatively an appropriate electrode material must be selected which does not significantly interdiffuse or react with the ferroelectric material.

For example, processes are described for formation of ferroelectric capacitors based on a conventional thin capacitor cell structure, using multilayer electrodes in U.S. Pat. No. 5,122,477 to Wolters et al. (Philips) entitled "Method of manufacturing a semiconductor device comprising capacitors which form memory elements and comprise a ferroelectric dielectric material having multilayer lower and upper electrodes". Selected metal and metal oxide electrode materials for thin film capacitors with ferroelectric dielectrics are described in U.S. Pat. No. 5,122,923, to Matsubara (NEC) entitled "Thin film capacitors and process for manufacturing the same". Other thin film ferroelectric capacitor structures are described in U.S. Pat. No. 5,109,357 to Eaton, Jr. (Ramtron) entitled "DRAM memory cell and method for operation thereof for transferring increased amount of charge to a bit line" and U.S. Pat. No. 5,187,638 to Sandhu (Micron Technology) entitled "Barrier layers for ferroelectric and PZT dielectric on silicon".

However, it is desirable for bipolar CMOS integrated circuits that a process for forming a ferroelectric capacitor should be compatible with conventional known silicon process technology, so that ferroelectric elements may be fully integrated with bipolar and CMOS integrated circuit devices with a minimum number of additional mask levels, and without unduly adding to the overall number of process steps and process complexity.

SUMMARY OF TEE INVENTION

Thus, the present invention seeks to provide a method of forming a capacitor and a capacitor structure which avoid or reduce the above-mentioned problems.

According to one aspect of the present invention, there is provided a capacitor structure for a memory element of an integrated circuit formed on a substrate, comprising: a first conductive layer defining a first electrode on the substrate; an overlying layer of a first dielectric material defining sidewalls of a via extending through the first dielectric over the first electrode; the via being filled with a layer of a capacitor dielectric material characterized by a higher dielectric strength than the first dielectric material, the capacitor dielectric layer contacting the underlying first electrode, and the capacitor dielectric having a surface coplanar with a surface of the surrounding first dielectric layer; and, a second conductive layer defining a second electrode contacting the surface of the capacitor dielectric.

Thus a simple compact capacitor structure is provided in which a capacitor dielectric is localized within a via opening defined in a surrounding first dielectric layer.

The structure allows for fabrication of the capacitor without the need for conventional patterning and etching of the capacitor dielectric.

The capacitor structure can accommodate capacitor dielectrics comprising conventional high dielectric strength dielectrics, e.g. tantalum oxide, or advantageously, ferroelectric dielectrics, e.g. PZT and other perovskite ferroelectric dielectric materials, which may be deposited in the via opening by any suitable known method. Preferably, when the dielectric is a ferroelectric or other dielectric which may react with the surrounding first dielectric layer, a dielectric barrier layer is provided lining sidewalls of the via opening. Conveniently this is provided as a sidewall spacer of a nonconductive dielectric material, for example aluminium oxide, silicon oxynitride or other suitable dielectric which functions as a diffusion barrier between the first dielectric and the capacitor dielectric. Underlying the first dielectric layer, a first (bottom) electrode is provided conventionally, i.e. by deposition and patterning of the first conductive layer. The capacitor structure is completed with an overlying second conductive layer which defines a second (top) conductive electrode contacting the capacitor dielectric within the via opening. Preferably, the material of the first and second conductive layers contacting the capacitor dielectric directly. However, if required, the first and second electrodes may comprise a conductive barrier layer between the capacitor dielectric and the conductive layer.

Preferably, any surface of the capacitor dielectric which are not in contact with an electrode is encapsulated by a dielectric barrier layer, which may be the same material as the dielectric sidewall spacers, to reduce interactions with surrounding dielectric materials. Thus, the capacitor dielectric is confined between the capacitor electrodes within the via opening in the first dielectric. The strong dielectric makes contact with the electrodes and otherwise is encapsulated by a dielectric barrier material to prevent unwanted interactions with surrounding dielectric materials.

Advantageously the capacitor structure is provided by a process which is results in fully planarized surface topography, so that the first dielectric and the capacitor dielectric have coplanar surfaces to simplify the structure of subsequent layers of contact and interconnect metallization.

Thus a simple compact capacitor structure is provided in which superior dielectric properties of high dielectric strength materials, including, for example, ferroelectrics, may be utilized. The capacitor structure is compatible with bipolar, CMOS and bipolar CMOS integrated circuits.

According to another aspect of the present invention, there is provided a method of fabricating a capacitor for a memory element of an integrated circuit on a substrate, comprising: providing a first conductive o layer defining a first conductive electrode on the substrate; providing a first dielectric layer thereon; defining an opening through the first dielectric layer, the opening having steep sidewalls and exposing the first conductive electrode within a bottom of the opening; filling the opening with a capacitor dielectric material, the capacitor dielectric material characterized by a dielectric strength greater than that of the first dielectric material; planarizing the resulting structure to provide a surface of the capacitor dielectric material coplanar with a surrounding surface of the first dielectric layer; and providing a second conductive layer defining a second electrode contacting the surface of the capacitor dielectric material.

Thus a straightforward process is provided in which a capacitor dielectric is localized within a via opening formed in a first dielectric material overlying a first electrode. The via opening typically has dimensions typical of a minimum critical dimension of the process, e.g. a contact hole or via diameter. Preferably, the capacitor dielectric is provided by deposition overall of a layer of capacitor dielectric, and then etching back and planarization of the resulting structure is accomplished by chemical mechanical polishing (CMP) to provide a fully planarized surface topography. If required, the first dielectric layer may comprise a surface layer of a CMP resistant material to provide a polish stop layer as is conventional for CMP. A planar topography simplifies subsequent processing steps, e.g. provision of contact metallization. Moreover, when the capacitor dielectric is a ferroelectric dielectric material, or a dielectric for which a dry etch process is not feasible, conventional patterning and etching of the ferroelectric dielectric is avoided.

Preferably, when the capacitor dielectric comprises a material which may interact with the first dielectric, the method comprises providing a dielectric barrier layer lining sidewalls of the opening before the step of filling the opening with a capacitor dielectric.

Thus when the capacitor dielectric comprises a ferroelectric dielectric material, a suitable dielectric barrier layer is provided to prevent interaction with the surrounding first dielectric layer. Conveniently, forming a the dielectric barrier layer comprises forming non-conductive dielectric sidewall spacers by a conventional process, i.e. conformal deposition and anisotropic etching.

After etching back to leave a planarized interface with coplanar areas of the first dielectric material and the capacitor dielectric, the second conductive layer is provided to define a second (top) electrode. If required, the first and second electrodes comprise a conductive barrier layer contacting the capacitor dielectric.

The second electrode may comprise part of a first level of interconnect in direct contact with the capacitor dielectric within the via opening. For example, another layer of a third non-conductive dielectric material is deposited overall to encapsulate any exposed surfaces of the capacitor dielectric layer, then a contact hole is opened to expose the capacitor dielectric and compatible contact metallization is provided by a known process.

Alternatively, after providing a second conductive layer and defining a top electrode, the method comprises encapsulating with a dielectric barrier layer any exposed surfaces of the capacitor dielectric layer which are not contacting the second electrode, to reduce diffusion and interaction with surrounding layers. The barrier layer may be the same material as that forming the sidewall spacers. Subsequently a conventional inter-metal dielectric is deposited overall and an electrode contact and interconnect metallization are provided by a conventional method.

In an alternative method of forming a barrier layer, controlled interdiffusion at the interface of the first dielectric and the capacitor dielectric creates an interface region of relatively stable mixed composition, which effectively acts as a barrier layer to further inter diffusion.

Thus a method is provided for a ferroelectric capacitor of compact structure in which a dielectric diffusion barrier reduces interactions between the ferroelectric material and other semiconductor materials.

The present invention provides a capacitor structure and method of forming a capacitor structure which allows for integration of capacitor dielectrics including ferroelectric materials, and other dielectric materials of high dielectric strength, into capacitors in bipolar, CMOS, or bipolar CMOS integrated circuit fabrication processes. The method of forming the capacitor structure is adaptable to using various known methods of forming a capacitor dielectric comprising a ferroelectric dielectric material. The method requires a minimal number of additional process steps and mask levels to form a capacitor structure.

Thus, there is provided a capacitor structure and a method of forming a capacitor for an integrated circuit, in which the above mentioned problems are avoided or reduced.

BRIEF DESCRIPTION OF THE DRAWINGS

Embodiments of the invention will now be described by way of example, with reference to the accompanying drawings, in which.

DESCRIPTION OF THE PREFERRED EMBODIMENT

Figure 1:
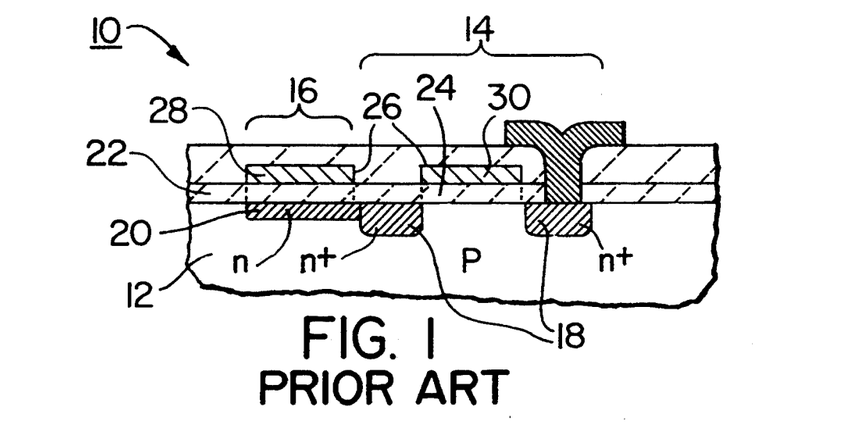
FIG. 1 shows a schematic cross-sectional view of a part of an integrated circuit including a conventional known prior art DRAM cell.

A conventional known prior art DRAM cell 10 constructed in a semiconductor substrate 12 comprising part of a p-type silicon wafer and including a transistor 14 and capacitor 16 is shown in FIG. 1. The transistor includes heavily n-doped regions of the substrate forming source and drain regions 18. An adjacent less heavily n-doped region 20 forms one electrode of the capacitor. An overlying dielectric layer provides a capacitor dielectric 22, and a gate dielectric 24 of the transistor. A conductive layer 26 of doped polysilicon forms a second electrode 28 of the capacitor structure and the gate electrode 30 of the transistor. Thus, a structure of this type makes use of the silicon substrate and polysilicon layer to provide respectively the first and second capacitor electrodes 20 and 28. However, since most ferroelectric capacitor dielectrics of interest in the present application would react with silicon and polysilicon layers, this structure is not feasible as a ferroelectric capacitor.

Figure 2:
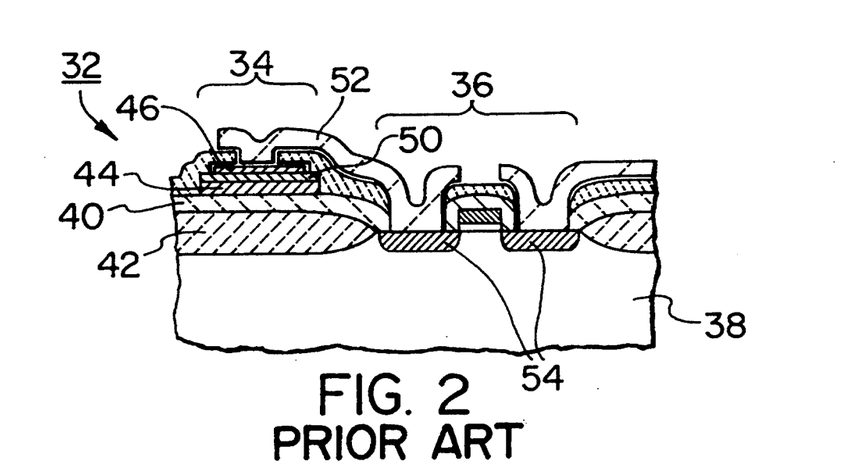
FIG. 2 shows a schematic cross-sectional view of a part of an integrated circuit including another conventional known prior art DRAM cell.

In another known prior art DRAM cell 32 as shown in FIG. 2, comprising a capacitor 34 and a transistor 36 formed on a substrate 38, the capacitor 34 is provided on a layer of dielectric 40 overlying the field isolation region 42. Electrodes 44 and 46 are formed with an intervening capacitor dielectric layer 50. Interconnect metallization 52 contacts the top electrode 46 of the capacitor and connects with the source/drain region 54 of the access transistor 36. The resulting topography is non-planar. The electrodes 44 and 46 comprises a multilayer structure of conductive layers. Thus, patterning and etching of a plurality of layers comprising the conductive electrode materials and the capacitor dielectric material are required. The etch process may present problems if the capacitor dielectric is a ferroelectric material.

Figure 3:
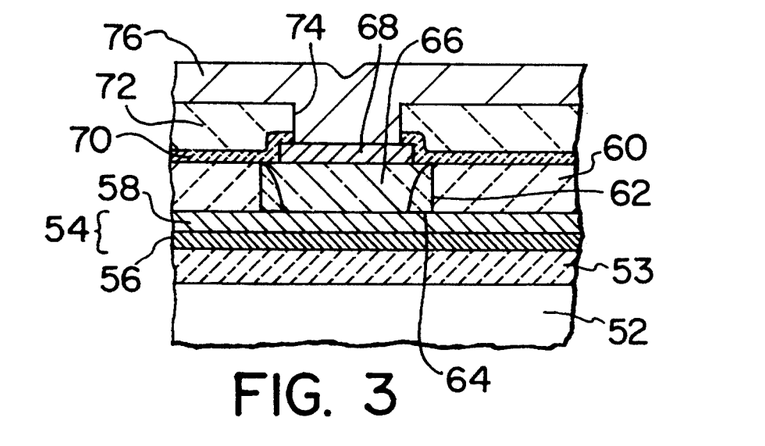
FIG. 3 shows a schematic cross-sectional view of part of an integrated circuit including a capacitor structure according to a first embodiment of the present invention.

In an integrated circuit according to a first embodiment of the present invention, a capacitor 50 of a memory element is provided on a conventional substrate 52 for an integrated circuit, in the form of a P type, <100> semiconductor silicon wafer, part of which is shown in FIG. 3. The substrate comprises elements of a partially fabricated integrated circuit which includes other electronic device structures (not shown). A first conductive layer provided on the substrate forms a first (bottom) electrode 54 of the capacitor isolated from the semiconductor substrate by a non-conductive dielectric layer 53. A single layer 54 of a suitable conductive metal, alloy or conductive metal oxide may be provided. Alternatively as shown, the electrode 54 comprises a multilayer structure, comprising a conductive metal, or metal oxide layer 56 and a conductive barrier layer 58, e.g. a conductive oxide. An overlying layer of a conventional dielectric 60 material defines a via opening 62. The via opening is filled with capacitor dielectric material 66. The capacitor dielectric material is characterized by a higher dielectric strength than the first dielectric and may comprise a conventional high dielectric strength dielectric, or preferably a ferroelectric dielectric material. The capacitor dielectric 66 is isolated from the first dielectric layer 60 by an intervening dielectric barrier layer 64, in the form of sidewall spacers. Advantageously, when the capacitor dielectric is a ferroelectric material, the barrier layer 64 functions as a diffusion barrier to prevent interaction between the ferroelectric dielectric 66 and the conventional dielectric 60. A second conductive electrode 68 of single or multilayer construction, similar to the first electrode, is provided on the second dielectric material 66 and completes the capacitor structure. An overlying layer of a dielectric barrier layer 70 encapsulates any surfaces of the second dielectric layer 66 not in contact with the electrode, and another layer of a conventional dielectric 72 is provided. A contact hole 74 is opened through dielectric layers 70 and 72 and a contact to the second electrode is provided in a conventional manner, for example by a conductive layer 74 comprising interconnect metallization 76.

Figure 4:
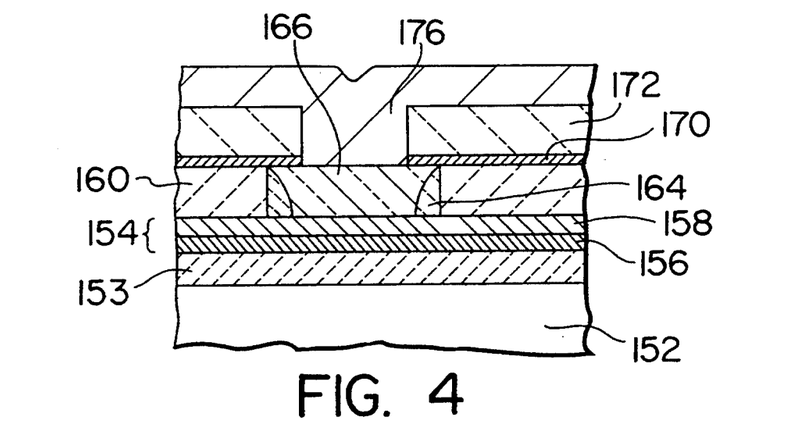
FIG. 4 shows a schematic cross sectional view of a part of an integrated circuit including a capacitor structure according to a second embodiment of the present invention.

In an integrated circuit including a capacitor structure according to a second embodiment, the structure is similar to that of the first embodiment, in that a first electrode 154 is provided on a substrate 152, and a capacitor dielectric 166, i.e. a ferroelectric dielectric material, is isolated from the surrounding conventional dielectric material 160 by a dielectric barrier layer 164 in the form of sidewall spacers 164 formed within the opening in the first dielectric layer 160. However, the structure differs in that a planar overlying dielectric layer is provided which comprises a first layer of a dielectric barrier 170 and an overlying layer of a conventional dielectric 172 encapsulates the surface of the ferroelectric dielectric 166 and extends over adjacent coplanar surfaces of the dielectric layer 160. A contact hole is provided through both the dielectric layers 170 and 172. An overlying conductive layer 176 extends into the contact hole 174 and makes direct contact with the capacitor dielectric. The latter structure is feasible when the conductive layer 176 forming the interconnect metallization and comprises a metal, or metal alloy, which is compatible with the ferroelectric material, so that a direct contact with the ferroelectric layer may be formed. Thus the necessity for forming a separate second electrode as in the first embodiment is avoided.

In capacitor structures according to both the first and second embodiments, the capacitor dielectric is provided in a via opening formed in the first dielectric layer. Thus patterning and etching of the second dielectric layer are avoided. Where the capacitor dielectric is a ferroelectric material, the structure provides that, other than direct contacts between the capacitor dielectric and the electrodes, the capacitor dielectric is encapsulated in a dielectric barrier layer. The barrier layer is provided by a non-conductive material which does not react significantly with the capacitor dielectric material and functions as a diffusion barrier to impurities and prevents reactions with surrounding materials.

Ideally, the via opening containing the capacitor dielectric and overlying contact vias for metallization are formed with minimum geometry, i.e. minimum critical dimensions. In practice, however, the via opening containing the capacitor dielectric may be made larger than the contact via for subsequent metallization layers, as shown in the figures, to ease tolerances for contact misregistration, and thus improve manufacturability.

Figure 5:
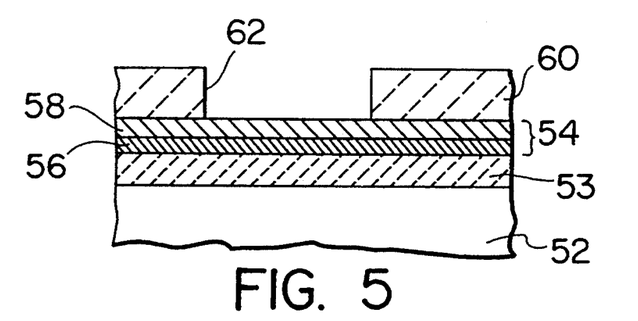
FIGS. 5 to 12 show schematic cross-sectional views of part of a partially fabricated integrated circuit structure at successive stages in forming a capacitor of a memory cell according to a first embodiment of the present invention.

In a method of fabricating an integrated circuit comprising a capacitor structure according to the first embodiment, a partially fabricated integrated circuit is provided on a semiconductor substrate 52 having a surface isolation layer 53 of a non-conductive dielectric material. A first conductive layer 54 is deposited on the substrate and patterned conventionally to define a first (bottom) electrode of the capacitor. The electrode comprises a plurality of conductive layers, for example comprising a metal layer 56 and an overlying suitable conductive barrier layer 58 of a conductive metal oxide. Alternatively the conductive electrode comprises a single layer 54 of a suitable conductive metal or metal oxide compatible with the capacitor dielectric to be deposited thereon.

A thin layer 60 of a conventional dielectric material, is deposited overall, and patterned and etched to define a steep sided opening 61 exposing the underlying first conductive electrode 54. The steep sided opening 61 is formed by a known conventional method of anisotropic etching, as is well understood in the industry. The opening has dimensions typical of a contact hole or via opening.

Typically, the dielectric isolation layer 60 comprises a layer of a dielectric, e.g. ~1000 Å silicon dioxide formed by chemical vapour deposition. Thus, for example in a $\leq 0.5$ µm linewidth process, the aspect ratio of the opening may be about 1:4 (depth:width).

The first dielectric layer 60 may be any conventional dielectric such as silicon dioxide, silicon nitride, silicon oxynitride, e.g. formed by a chemical vapour deposition process. Alternatively the first dielectric layer may comprise a polymer dielectric.

After defining the opening 62, a localized dielectric barrier layer 64 is formed on sidewalls of the dielectric layer within the opening as will be described below, and then the opening is filled with a capacitor dielectric.

The capacitor dielectric material is deposited by a known method to fill the opening, level with the surface of the dielectric layer. Filling of the opening may be accomplished, for example, by deposition overall of the second dielectric layer, followed by planarization which includes removal, by etching back or polishing, of the capacitor dielectric to a level coplanar with the surface Of the first dielectric. Deposition may be accomplished by an suitable known process, e.g. by a sol-gel deposition, CVD, sputtering, laser ablation, spin on glass. A preferred ferroelectric dielectric material is PZT, deposited by a sol-gel process or by CVD. Other perovskite ferroelectric dielectrics, ferroelectric oxide materials, and non-ferroelectric high dielectric strength materials, i.e. selected non-conducting metal oxides, e.g. tantalum oxide, may alternatively be used.

The resulting structure, including the surface layer of ferroelectric material, is etched back to provide a fully planarized surface and so that the ferroelectric material fills the opening to a level coplanar with the surrounding surface of the first dielectric layer. Preferably, the first dielectric layer includes a surface layer of a chemical mechanical polish resistant material, so that etching back may be accomplished readily by chemical mechanical polishing, thereby selectively removing layers extending above the planar surface of the polish resistant layer on the substrate to provide a fully planarized surface. If required a CMP resistant layer of e.g. silicon carbide, silicon nitride or boron nitride is provided on the surface of the first dielectric material before deposition of the ferroelectric material. Thus etch back of the ferroelectric material is readily achieved, providing a fully planar topography, and avoiding problems with other known methods of dry &/or wet etching of ferroelectric dielectric materials.

Depending on the method of deposition, annealing of a ferroelectric capacitor dielectric may be required to crystallize and densify the material. A suitable anneal step after deposition of a ferroelectric layer, if required, may comprise for example, heat treatment in an oxygen containing atmosphere at 600°–700° C. During heating, the barrier material forming the sidewall spacers 64 acts as a diffusion barrier to impurities in the ferroelectric layer to prevent interaction of the ferroelectric material and the first dielectric material.

Figure 6:
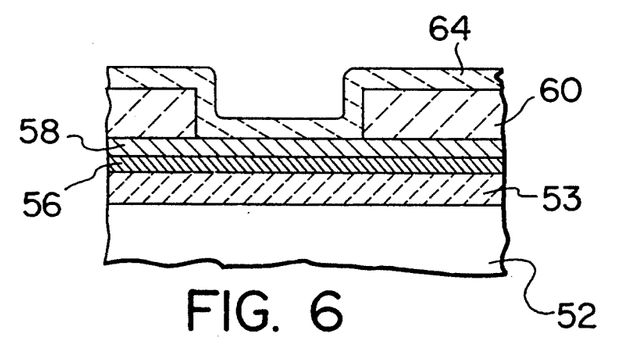
Figure 7:
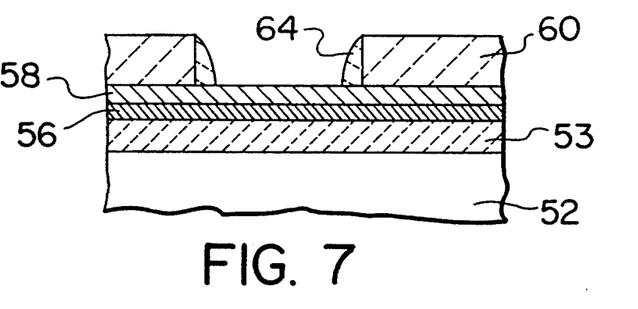
Figure 8:
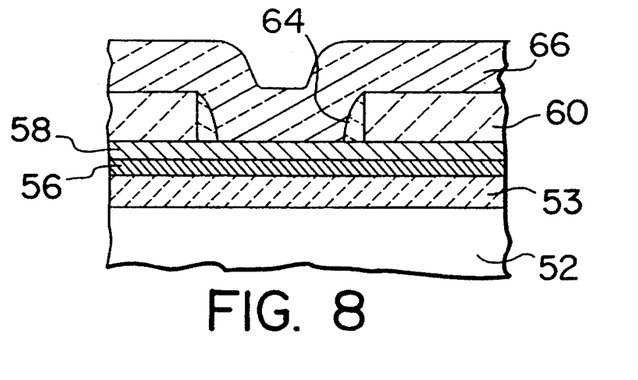
Figure 9:
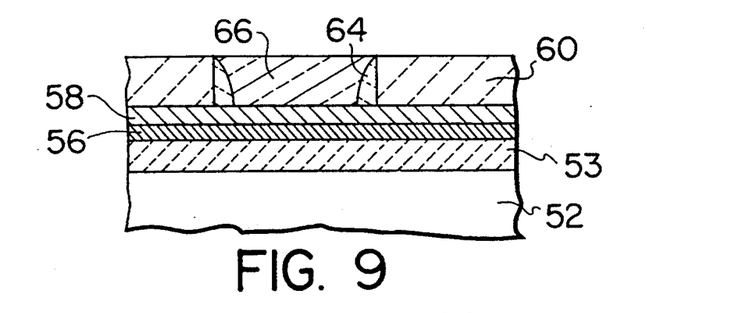
Figure 10:
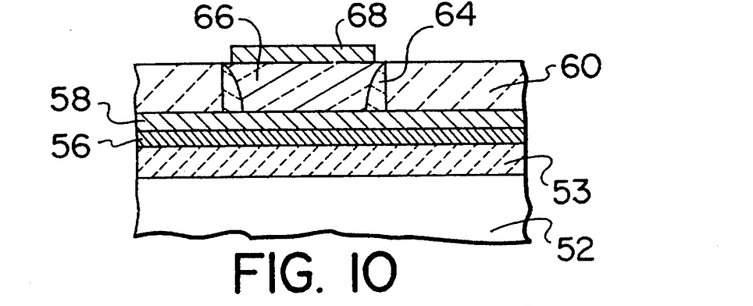
Figure 11:
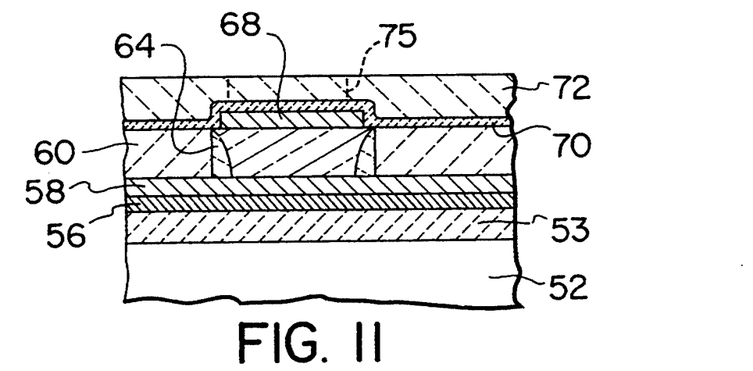

Thus, dielectric barrier layer 64 may be formed as sidewall spacers 64 of a layer of a suitable dielectric material, for example $Al_2O_3$, which is provides a diffusion barrier between the ferroelectric dielectric material and the first dielectric material. Sidewall spacers 64 within the opening are formed by a conventional method, e.g. deposition overall of the dielectric barrier layer 64 (FIG. 6), followed by anisotropic etching to expose the underlying first electrode layer within the bottom of the opening, leaving tapered sidewalls 64 as shown in FIG. 7.

Figure 12:
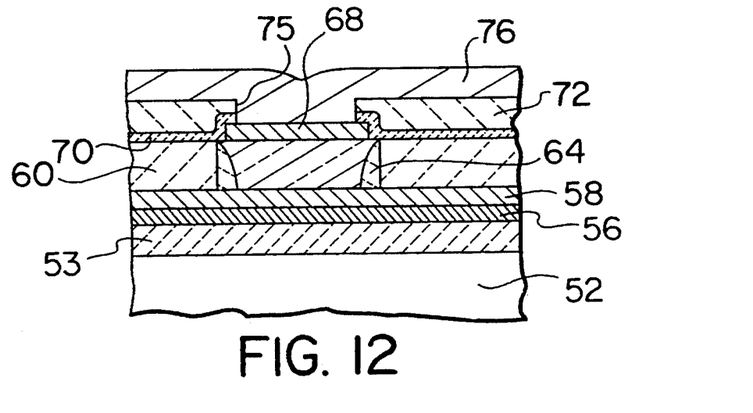
Figure 13:
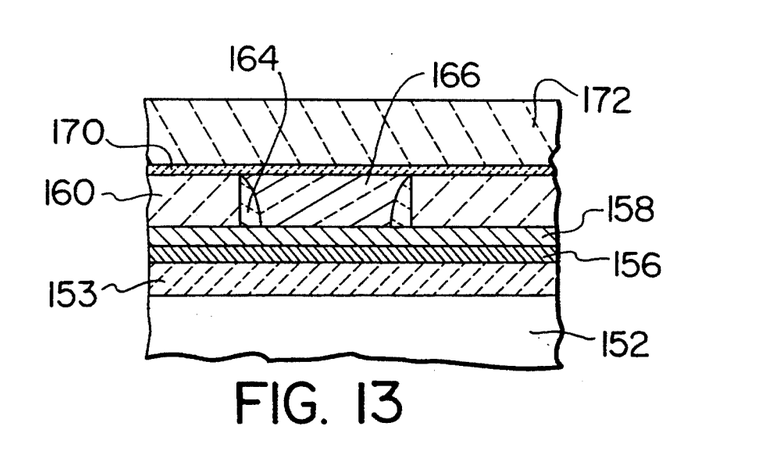
FIG. 13 to 15 show schematic cross-sectional views of part of a partially fabricated integrated circuit structure at successive stages in forming a capacitor of a memory cell according to a second embodiment of the present invention.
Figure 14:
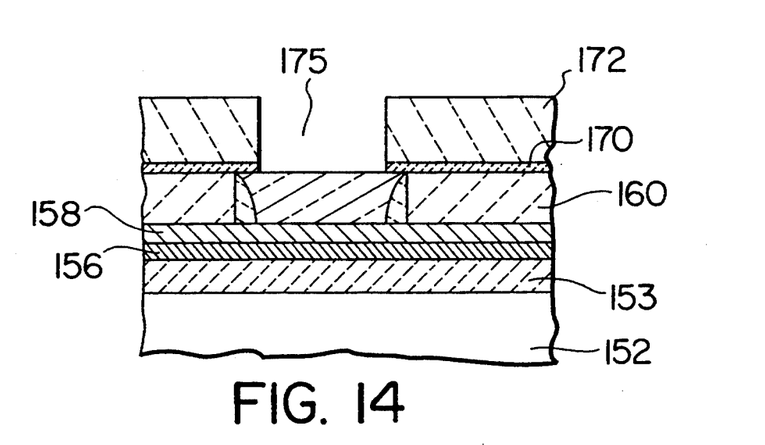
Figure 15:
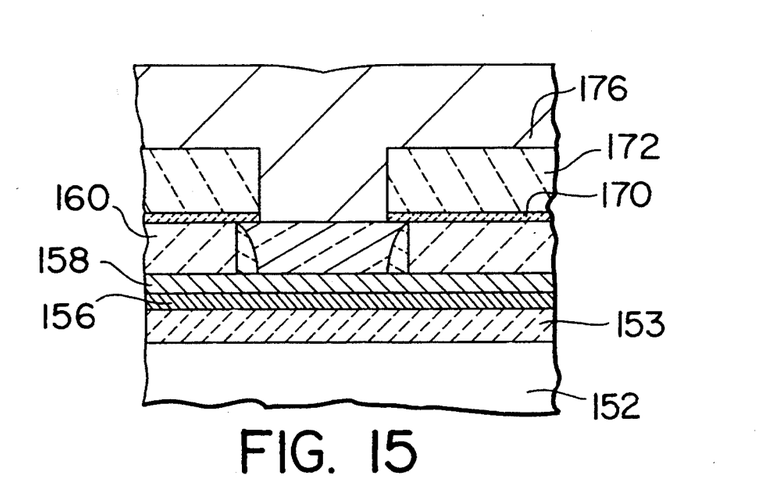

To complete the capacitor structure, a second conductive layer 68 is provided overall and patterned to define a second (top) contact electrode of the capacitor on the surface of the region filled by the ferroelectric dielectric. The second electrode may comprise for example, Pt, or other suitable noble metal, metal alloy, or a conductive metal oxide, e.g. $RuO_2$. Alternatively the electrode may comprise a multilayer structure of a plurality of conductive layers including a conductive barrier layer and an overlying conductive metal layer, e.g. $Pt/RuO_2$. The latter is similar in construction to the first electrode, with the barrier layer lying between the ferroelectric material and the conductive electrode material. The second electrode 68 is patterned to defined a contact an area on the planarized surface of the ferroelectric material 66. Subsequently an overlying dielectric comprising a layer 70 of a dielectric barrier material, e.g. $Al_2O_3$ the same as the sidewall spacers is provided overall to encapsulate exposed surfaces of the ferroelectric layer. An overlying layer 72 of a conventional dielectric, e.g. silicon dioxide, provides an additional thickness of dielectric before formation thereon of conventional interconnect metallization. As shown in FIG. 12, a contact hole 75 is defined through the dielectric layers 70 and 72 and overlying contact metallization 76 contacts the second electrode 68 within the contact hole.

Contacts to the top electrode are subsequently provided by conventional steps including anisotropically etching the dielectric layers to open a contact hole and deposition of conductive metal layer. Suitable contact metallization comprises an Al alloy, tungsten or copper, or other suitable known conductive metals and alloys.

If a heat treatment step has not been included at some stage earlier in the process after deposition of the ferroelectric layer to anneal and crystallize the ferroelectric material, deposition of contact metallization at elevated temperature, e.g. tungsten which requires a high temperature process, may also serve to anneal the capacitor dielectric.

Thus the resulting capacitor structure is simple, very compact, and may be fabricated in a process compatible with known bipolar and CMOS integrated circuit processes.

Non-conductive dielectric materials, other than $Al_2O_3$, suitable for forming the sidewall spacers include for example, $Ta_2O_5$, AlN, MgO, $SrTiO_3$, silicon oxynitride and other dielectric materials which provide a barrier to unwanted interdiffusion and reaction of the surrounding dielectric layer and a ferroelectric layer.

Although other known etch back methods, i.e. RIE, may be used, preferably CMP is used to avoid difficulties with dry etching of some ferroelectric materials by RIE. Also, CMP is a preferred etch back method because the resulting structure is fully planarized, which reduces topography related lithography problems in subsequent processing steps, i.e. formation of contact metallization. If required, polish stop layers may be selectively removed after CMP before proceeding with subsequent process steps.

Following are two examples of process flows for forming capacitors using PZT as a capacitor dielectric, according the the first and second embodiments respectively. Although particulary materials are given by way of example, it will be apparent that many alternative materials and deposition methods may be selected for the electrode materials, barrier layers, depending on the compatibility with the selected capacitor dielectric and the overall process technology.

Example I shows of a process flow for a PZT ferroelectric capacitor having first and second electrodes of platinum and fabricated by a method according to the first embodiment. The first conductive layer comprises platinum. An underlying adhesion layer of sputtered titanium provides improved adhesion of the first conductive layer to an underlying isolation layer. After defining the first platinum electrode, the first dielectric is deposited, which comprises 100 nm of silicon dioxide. The barrier layer comprises dielectric sidewall spacers formed from aluminium oxide. The layer of ferroelectric PZT is deposited by chemical vapour depostion, and is slightly thicker than the silicon dioxide layer so as to completely fill the via opening in the silicon dioxide layer. After annealling the layer of PZT, etching backby CMP provides a planar surface for formation of the second electrode. The second electrode is formed by deposition of a second conductive layer of platinum. The second electrode is patterned and defined on the planarized surface of the PZT within the via opening. Another layer of aluminum oxide is then deposited overall to encapsulate exposed surfaces of the PZT around the second electrode. A conventional intermetal dielectric layer of silicon dioxide is then deposited, and a contact hole is opened through the silicon dioxide and aluminium oxide layers to expose the second electrode. A contact to the second electrode is formed by a conventional metallization process using aluminium alloy. Process flow:

Example I provide semiconductor substrate having a layer of oxide as isolation for a bottom electrode;

provide adhesion layer of 10–30 nm of titanium deposited by sputtering form a layer of 200–400 nm Pt and define a bottom electrode provide overall a first dielectric layer of a 100 nm silicon dioxide etch a via opening through oxide deposit overall by CVD a a non-conductive dielectric barrier layer of $Al_2O_3$ anisotropically etch back $Al_2O_3$ to form sidewall spacers (SWS) within contact opening fill the via opening by deposition of a ferroelectric capacitor dielectric layer of ~120 nm PZT by CVD anneal PZT at 500°–700° C., in oxygen ambient etch back by CMP to provide ferroelectric surface coplanar with the surface of the first dielectric layer deposit overall conductive layer of 200 nm–400 nm Pt for top electrode pattern Pt layer to define second top electrode on PZT within area bounded by the SWS deposit another dielectric barrier layer of $Al_2O_3$ [i.e. same material as SWS] to encapsulate exposed surfaces of PZT deposit intermetal dielectric layer of 500 nm–1 $\mu$m $SiO_2$ etch contact hole to second electrode through $SiO_2$ and dielectric barrier layers deposit metal for contact to top electrode, aluminium In a method of forming a capacitor structure according to a second embodiment, the process steps are similar to those described above for the first embodiment, except that after providing the layer of the second dielectric and etching back, a layer 170 of a dielectric barrier dielectric material is provided overall, followed by an additional thickness of a conventional dielectric 172. A contact hole 175 is opened through the layers 170 and 172, and a first layer of metallization 176 is deposited overall. The metallization 176 comprises a metal or metal alloy which extends into the contact hole making direct contact with the second dielectric and thereby forming the top of the capacitor. The latter structure is suitable when the interconnect metallization 176 comprises a noble metal (e.g. Pt), noble metal alloy, tungsten or other conductive material compatible with a direct contact to the ferroelectric material 166. In the latter case, formation of a top contact electrode which is separate from the interconnect metallization is avoided.

Example II shows a process flow for a PZT ferroelectric capacitor having electrodes fabricated by a method according to the second embodiment.

Example II provide semiconductor substrate having a layer of oxide as isolation for a bottom electrode;

provide adhesion layer of 10–30 nm of titanium deposited by sputtering form a layer of 200–400 nm Pt and define a bottom electrode provide overall a first dielectric layer of a 100 nm silicon dioxide etch a via opening through oxide deposit overall by CVD a a non-conductive dielectric barrier layer of $Al_2O_3$ anisotropically etch back $Al_2O_3$ to form sidewall spacers (SWS) within contact opening fill the via opening by deposition of a ferroelectric capacitor dielectric layer of ~120 nm PZT by CVD anneal PZT at 500°–700° C., in oxygen ambient etch back by CMP to provide ferroelectric surface coplanar with the surface of the first dielectric layer deposit another layer of dielectric barrier material [e.g. $Al_2O_3$, same material as that forming SWS] overall to encapsulate exposed surfaces of PZT deposit a dielectric layer, e.g. $SiO_2$, 500 nm–1 $\mu$m etch a contact hole to the PZT through the dielectric layer and the dielectric barrier layer deposit overall a conductive layer to provide contact-/interconnect metallization comprising, e.g. 200 nm–400 nm W In the examples above, the ferroelectric material is preferably fine grained PZT, having grains size <100 nm. Depending on the method of deposition of the PZT, a thermal process step may be required to anneal and crystallize the as deposited ferroelectric material. This step may comprise a separate anneal step directly after deposition of the ferroelectric material. Alternatively, at a later stage in processing, a suitable thermal process may comprise part of a subsequent high temperature step, e.g. during a metallization step.

In Example II, the interconnect metallization is used to form a direct contact to the PZT. A separate second electrode is not defined. If necessary, a thin barrier layer is provided between the interconnect metallization and the capacitor dielectric.

In a modifications of capacitors formed according to Examples I and II, the electrodes may comprise alternatively a multilayer conductor, including two or more layers of a conductive metal or metal oxide, at least one of which provides a conductive barrier layer compatible with the ferroelectric material, for example $RuO_2$/Pt if the ferroelectric is PZT.

Figure 16:
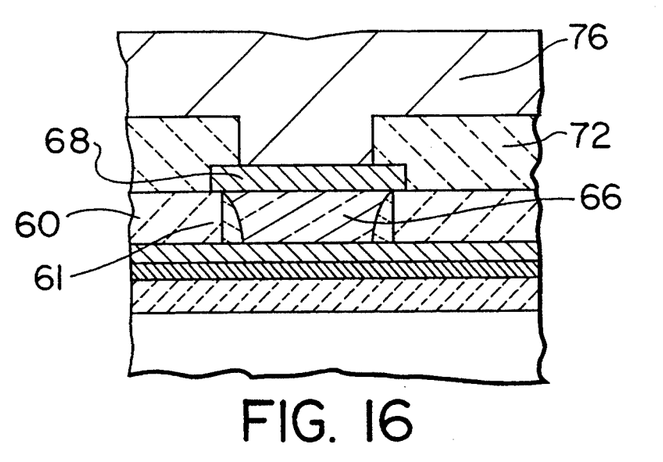
FIG. 16 shows a schematic cross-sectional view of a capacitor structure according to a modification of the first embodiment of the present invention.

In the capacitor structure according to the first embodiment shown in FIG. 3, the top electrode is defined within the area of the capacitor dielectric material. In a modification of a capacitor structure according to a first embodiment (FIG. 16), the top (second) capacitor electrode 68 is larger than that shown in FIG. 3, so as to extend over the boundary between the capacitor dielectric 66 and the surrounding dielectric 60. The latter structure maximizes the area of use the capacitor dielectric, and may be used when degradation of the surrounding dielectric between the electrodes, i.e. in region 61, is not a significant problem. Also, since the capacitor dielectric is completely covered by the top electrode, the dielectric barrier layer 70 (FIG. 3) is not required and the dielectric layer 76 is deposited directly on the layer 60 surrounding the top electrode 68.

Figure 17:
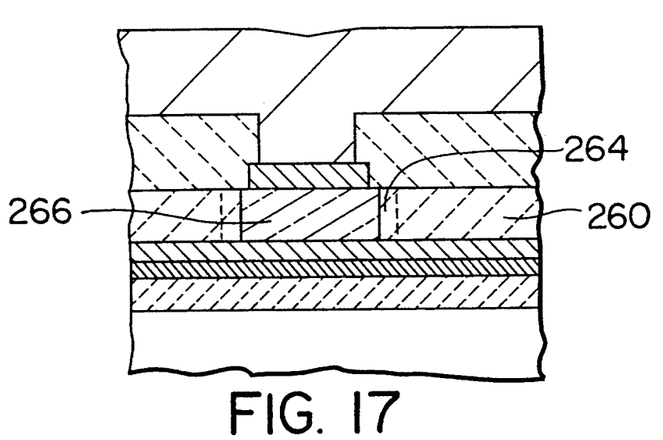
FIG. 17 shows a schematic cross-sectional view of a capacitor structure according to a third embodiment of the present invention.

In a capacitor structure according to a third embodiment, FIG. 17 the structure is similar to the capacitor structure of the first and second embodiments except that the barrier layer 264 comprises an interface region 264 formed by interdiffusion of the first dielectric layer 260 and the capacitor dielectric layer 266. The latter may be accomplished during annealling of the capacitor dielectric layer 266 or during another heat treatment step.

Figure 18:
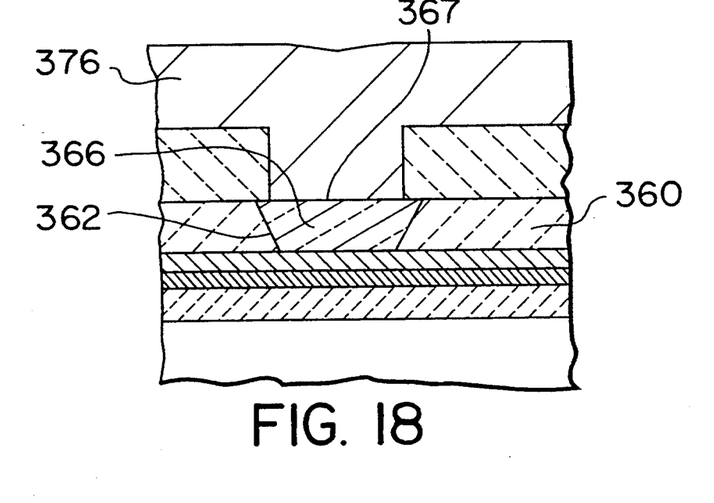
FIG. 18 shows a schematic cross-sectional view of a capacitor structure according to a fourth embodiment of the present invention.

In a capacitor according to a fourth embodiment, FIG. 18, the structure is similar to that of the first and second embodiments, except that a tapered via opening 362 is defined in the first dielectric layer 360. The latter may be provided by any known conventional method to form a tapered via. The tapered opening 362 allows for an increased contact area 367 on the top surface of the capacitor dielectric which may be desirable to simplify alignment of subsequent metallization layers 376. Thus a simple capacitor structure is provided which takes advantage of superior dielectric properties of high strength dielectrics and ferroelectric dielectric materials. A simple process is provided in which conventional patterning and etching of the capacitor dielectric is avoided by confining the capacitor dielectric within a contact opening is a conventional dielectric. A dielectric barrier layer reduces avoids problems of interdiffusion of impurities.

The present invention provides for a capacitor having comprising a high strength dielectric or ferroelectric dielectric which is compatible with silicon integrated circuits. In particular ferroelectric capacitor structures may be integrated with BiCMOS, CMOS and Bipolar integrated circuits. [However, it will also be apparent that the capacitor modifications of the embodiments may be provided, by a suitable choice of dielectric materials, which are suitable for integrated circuits using semiconductor substrates other than silicon, e.g. GaAs and other III-V materials].

Although particular embodiments of the invention have been described in detail, it should be appreciated that numerous modifications, variations and adaptations may be made without departing from the scope of the invention as defined in the claims.

What is claimed is:

1. A capacitor structure for a memory element of an integrated circuit formed on a substrate, comprising:
   a first conductive layer defining a first electrode on the substrate;
   an overlying layer of a first dielectric material defining sidewalls of a via extending through the first dielectric over the first electrode;
   the via being filled with a layer of a capacitor dielectric material characterized by a higher dielectric strength than the first dielectric material, the capacitor dielectric layer contacting the underlying first electrode, and the capacitor dielectric having a surface coplanar with a surface of the first dielectric layer; and,
   a second conductive layer defining a second electrode contacting the surface of the capacitor dielectric.

2. A capacitor structure for a memory element of an integrated circuit formed on a substrate, comprising:
   a first conductive layer defining a first electrode on the substrate;
   an overlying layer of a first dielectric material defining sidewalls of a via extending through the first dielectric over the first electrode;
   the via being filled with a layer of capacitor dielectric material characterized by a higher dielectric strength than the first dielectric material and a dielectric barrier layer lining sidewalls of the via and separating the capacitor dielectric from the first dielectric layer, the capacitor dielectric layer contacting the underlying first electrode and the capacitor dielectric having a surface coplanar with the surface of the first dielectric layer; and,
   a second conductive layer defining a second electrode contacting the surface of the capacitor dielectric.

3. A capacitor structure according to claim 2 wherein the capacitor dielectric comprises a ferroelectric dielectric material.

4. A capacitor structure according to claim 3 wherein the ferroelectric dielectric material comprises a perovskite structure ferroelectric material.

5. A capacitor structure according to claim 3 wherein the ferroelectric dielectric material comprises lead zirconate titanate.

6. A capacitor structure according to claim 2 wherein the dielectric barrier layer lining the via comprises a dielectric sidewall spacer.

7. A capacitor according to claim 3 wherein the dielectric barrier layer comprises a dielectric selected from the group consisting aluminium oxide, aluminium nitride, tantalum oxide, niobium oxide, strontium titanate, magnesium oxide and silicon oxynitride.

8. A capacitor structure according to claim 2 wherein the first dielectric is selected from the group consisting of silicon dioxide, silicon nitride, silicon oxynitride, polyimides and other polymer dielectrics.

9. A capacitor structure according to claim 2 wherein the dielectric barrier layer comprises an interface region between the first dielectric and the capacitor dielectric around sidewalls defining the via, the region comprising a mixing composition formed by interdiffusion of the first dielectric layer and the capacitor dielectric layer.

10. A capacitor structure according to claim 2 wherein the second conductive layer defining the second electrode comprises a first of interconnect metallization.

* * * * *